(12) United States Patent
Edamura et al.

(10) Patent No.: US 6,245,202 B1
(45) Date of Patent: Jun. 12, 2001

(54) PLASMA TREATMENT DEVICE

(75) Inventors: Manabu Edamura, Ibaraki; Ryoji Nishio, Mito; Ken Yoshioka, Kudamatsu; Saburo Kanai, Hikari, all of (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/155,906

(22) PCT Filed: Apr. 12, 1996

(86) PCT No.: PCT/JP96/01018

§ 371 Date: Aug. 18, 1999

§ 102(e) Date: Aug. 18, 1999

(87) PCT Pub. No.: WO97/39607

PCT Pub. Date: Oct. 23, 1997

(51) Int. Cl.[7] .................................................. C23C 14/34
(52) U.S. Cl. .............................. 204/298.06; 204/298.11; 156/345; 118/723 AN; 118/723 I; 118/723 IR
(58) Field of Search .................. 204/288.06, 298.09, 204/298.11, 298.12; 118/723 AN, 723 I, 723 IR; 216/68; 156/345

(56) References Cited

U.S. PATENT DOCUMENTS

| | | | |
|---|---|---|---|
| 5,401,351 | * | 3/1995 | Samukawa ........................... 156/345 |
| 5,580,385 | * | 12/1996 | Paranjpe et al. ................... 118/723 I |
| 5,622,635 | * | 4/1997 | Cuomo et al. ......................... 216/68 |
| 5,683,537 | * | 11/1997 | Ishii ..................................... 156/345 |
| 5,716,451 | * | 2/1998 | Hama et al. ......................... 118/723 |

FOREIGN PATENT DOCUMENTS

| | | | |
|---|---|---|---|
| 6-224155 | 8/1994 | (JP) | ............................... H01L/2/302 |
| 7-106096 | 4/1995 | (JP) | ................................. H05H/1/46 |

* cited by examiner

Primary Examiner—Nam Nguyen
Assistant Examiner—Steven H. VerSteeg
(74) Attorney, Agent, or Firm—Antonelli, Terry, Stout & Kraus, LLP

(57) ABSTRACT

In a high-frequency inductive plasma etching apparatus, a space between an antenna to which a high-frequency power is fed and a processing chamber is insulated with an insulating material having a suitable thickness, while the antenna is protected from a plasma or a reactive gas for plasma processing and the surface of a side in contact with the plasma is covered by an insulating material such as alumina and quartz. The insulating material and the antenna are placed in a vacuum. Since the processing chamber which contains the insulating material and the antenna can take a pressure differential with atmospheric pressure, all that is required of the insulating material is its capacity to take the plasma atmosphere. Consequently, the insulating material can be made thin and the plasma is generated uniformly in high density. Heat generated at the antenna is dissipated to the outside either by making a gap between the antenna and its surroundings as small as possible or by bringing the pressure of the gap closer to the pressure in the processing chamber. Alternatively, several Torr of a non-reactive heat-transfer promoting gas such as He gas may be introduced into fine gaps formed around the antenna to dissipate heat generated at the antenna.

16 Claims, 8 Drawing Sheets

PLASMA TREATMENT DEVICE

TECHNICAL FIELD

The present invention relates to a plasma treatment device and a plasma processing method for use in the manufacture of substrates and the like which can be used in semiconductors and liquid crystal displays, and more particularly, it relates to a plasma treatment device and a plasma processing method suitable for treatments such as etching and film formation.

BACKGROUND ART

With the large scale integration of semiconductor devices, the enlargement of diameters of semiconductor wafers and the increase of areas of liquid crystal displays, the requirements of a treatment device for carrying out etching processing and film formation processing on the semiconductors become severe year by year. Also with regard to a plasma treatment device such as a plasma etching apparatus, a plasma CVD apparatus and a plasma ashing apparatus, the above situations are similar. That is to say, in order to improve a throughput, the increase of the density of plasma and the enlargement of the area of workpieces to be processed as well as the realization of cleaning have become important themes.

As plasma sources for use in the above-mentioned plasma treatment device, there are a radio-frequency capacitively coupled plasma source, a microwave ECR plasma source, a radio-frequency inductively coupled plasma source and the like, and they are used separately in treatment process to make the best use of the characteristics of each plasma source. Among these three plasma sources, plasma treatment devices provided with the radio-frequency inductively coupled plasma source have rapidly come into wide use in recent years.

One example of the inductively coupled plasma treatment device is disclosed in Japanese Patent Unexamined Publication No. 2-235332. In this inductively coupled plasma treatment device, a high-frequency electric power on the order of several hundred kHz to several hundred MHz is fed to a loop, coil, or spiral-shape antenna which is placed on the outside of the processing chamber via an insulator such as quartz forming part of the chamber, and an induced electric field formed by the antenna supplies energy to a process gas introduced into the processing chamber to generate and maintain a plasma.

There is a case of providing an antenna inside the chamber of the plasma treatment device of the radio-frequency inductively coupled plasma. For example, Japanese Patent Unexamined Publication No. 7-106095 describes a case where a spiral-shape antenna which is a RF induction coil is set up at a position facing semiconductor wafers which is a workpiece in the chamber. In these RF inductively coupled plasma treatment devices, an induction current is generated in the plasma and the plasma and the high-frequency antenna are inductively coupled in terms of electric circuit (a transformer circuit which treats the antenna as the primary coil and the current in the plasma as the secondary coil). Therefore, this is called the inductively coupled plasma treatment device.

The advantages of the plasma treatment device of the inductively coupled plasma are: (1) in a simple and low-cost construction of a simple antenna and a radio-frequency electric power source, a plasma of relatively high density of $10^{11}$ to $10^{12}$ (piece/cm$^3$) can be generated under a low pressure of a few mTorr; (2) by arranging a coil in a planar manner facing the workpiece, a large-area plasma can be easily generated; and (3) because of the simple interior of the processing chamber, particles flying over the workpiece during processing can be reduced.

In such an inductively coupled plasma treatment device, a plasma of high density under low pressure is generated and the mean free path of ions becomes long. This makes it possible to true up the directions of ions incident upon the workpiece and a high processing rate and fine working can be obtained.

DISCLOSURE OF THE INVENTION

In the plasma treatment device described in the foregoing Japanese Patent Unexamined Publication No. 2-235332, a high-induction antenna is arranged on an atmosphere side via an insulator such as quartz with respect to a plasma in the processing chamber. As a result, the insulator must have sufficient strength to withstand atmospheric pressure, and in view of the current condition where a workpiece occupies a large area, it is necessary for the insulator to be made thick corresponding to the area of the workpiece.

It is also pointed out that the antenna and the plasma are capacitively coupled in addition to inductive coupling. And it frequently happens that the insulator is chipped by plasma. As a result, it is necessary to thicken the insulator in order to increase reliability sufficiently. When the insulator is made thick, as described in the paper by Keller et. al reported in Journal of Vacuum Science All (5), September/October 1993, p. 2487, the plasma generation efficiency greatly drops, giving adverse effects on plasmas ignitability and stability.

On the other hand, in the plasma treatment device disclosed in Japanese Patent Unexamined Publication No. 7-106095, the antenna is installed inside the chamber, so that the above-mentioned problem of generation efficiency can be solved to some extent. Nevertheless, new disadvantages as described hereinafter will occur.

Although the surface of the inductive antenna is protected by insulating materials, a strong plasma is normally generated around the antenna in case of the inductively coupled plasma apparatus. Therefore, damage to the protective film is extremely large in the apparatus such as a plasma etching apparatus using reactive gases. The antenna itself is made of metal, thus generating metallic ions when the protective film is broken and causing metallic contamination in the semiconductor wafers. Also, the antenna itself would need to be exchanged, necessitating a great deal of time and cost for maintenance. These are the disadvantages that would appear.

Further, there is another defect. Behind the antenna, there is installed a cooling plate which must be insulated against the antenna. In such construction, it is difficult for the cooling plate to be thermally put into close contact with the antenna. Under low pressure such as in vacuum or during plasma processing, heat transfer at the contact surface of structures is extremely poor, so that the cooling effect on the antenna by means of the cooling plate cannot be expected too much.

There is an additional disadvantage. Behind the antenna installed on the opposite side of the workpiece, there is also generated a plasma of as high density as that on the workpiece side. Since the plasma behind the antenna is not effectively used for plasma processing of the workpiece, the real plasma generation efficiency decreases and, at the same time, the chamber wall behind is subjected to the strong plasma.

The present invention is made to solve the abovementioned problems and disadvantages of conventional arts.

Namely, it is the object of the present invention to provide a plasma treatment device which can generate a stable plasma with high efficiency under wider operating conditions by solving the problems of the plasma generation efficiency in case of the plasma treatment device where the induction antenna is installed on the atmosphere side, and the problems of surface protection and cooling of the induction antenna as well as the problem of a decrease in efficiency due to plasma generation behind the antenna in case of the plasma treatment device installed inside the processing chamber. It is another object of the present invention to provide a plasma treatment device which has high reliability with ease of maintenance.

A first embodiment of the present invention to accomplish the foregoing objects is that the foregoing problems can be solved by building the induction antenna as an integral part of the chamber inside the processing chamber. The antenna to which a high-frequency power is fed is insulated with an insulating material of proper thickness against the chamber, and to protect it from the plasma or reactive gases for processing plasma, the surface in contact with the plasma is covered with the insulating material such as alumina or quartz. The antenna is in contact with the plasma via the insulating material. In the present invention, since the processing chamber part bears atmospheric pressure, contrary to a quartz window of the insulating material used for the prior-art plasma treatment device where induction coils are placed on the atmosphere side, this insulating material has no need of bearing atmospheric pressure, so that it can be made thin. For the insulating material to have a thickness unable to withstand atmospheric pressure, it is desirable not to make a gap between the antenna and its surrounding insulating material or to keep the pressure of this gap part close to the pressure inside the processing chamber. In fact, micro gaps or contact surfaces may structurally occur between the insulating material and the antenna. But as explained in the prior-art section, under low pressure, this part has a poor heat transfer causing a problem of heating the antenna. To solve this problem, for example, by making such a structure as to introduce a non-reactive gas such as He gas on the level of few Torr into the gaps surrounding the antenna, the antennas heat is allowed to escape to the adjacent insulating material which directly or indirectly is cooled. As a result, the antenna heating problem can be solved. And it is not necessary to make the insulating material between the plasma and the antenna thick for the pressure of this level.

The plasma treatment device of the present invention contributes to increasing the plasma generation efficiency and generating a stable plasma under a wider range of operating conditions. Moreover, even if the insulating material protecting the antenna should be chipped and reduced, only the insulating material needs to be replaced, thus improving maintenance performance as compared with the prior-art antenna. Consequently, plasma processing performance and the operating rate of the device will be improved and it becomes possible to perform fine etching process with high throughput, high quality film deposition, and surface treatment.

Other objects and advantageous effects of the present invention will be apparent from the following detailed description.

BEST MODE FOR CARRYING OUT THE INVENTION

Figure 1:
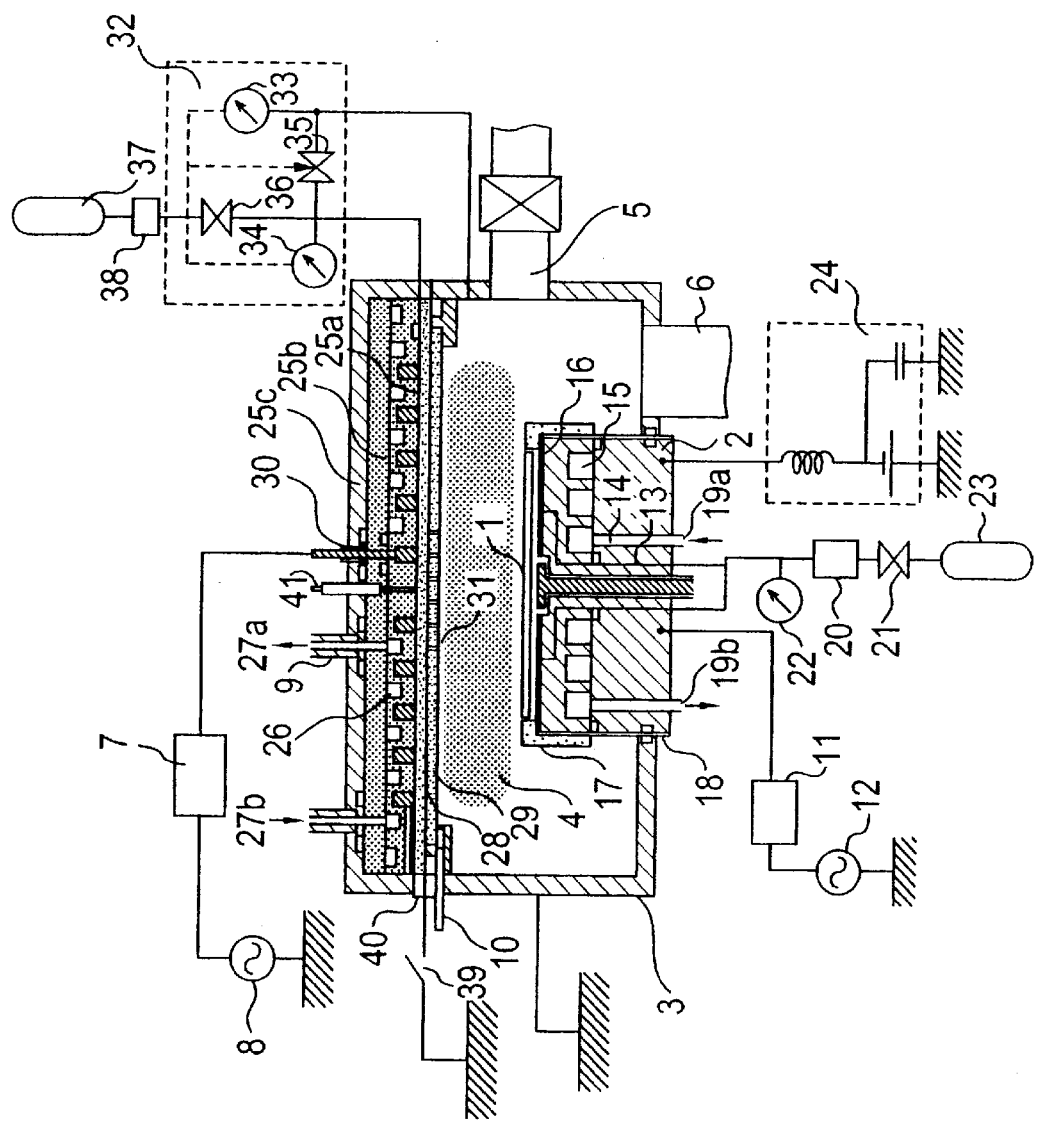
FIG. 1 is a schematic view of an embodiment of the plasma treatment device according to the present invention, showing a longitudinal sectional view of the main part.

FIG. 1 shows an embodiment of the plasma treatment device of the present invention. A processing chamber 3 is, for example, an aluminum-made vacuum vessel with its surface treated with Alumite and is electrically earthed. At the bottom of the processing chamber 3, vacuum exhaust means 6 to suck gas inside the chamber is installed, while at its side, a conveyor system 5 is set up to convey a semiconductor wafer 1, a workpiece, into and out of the chamber. In the processing chamber 3, there is installed an electrode 2 to mount the semiconductor wafer 1. The semiconductor wafer 1 having been conveyed by the carrier system 5 into the process chamber is moved above an electrode 2 by a pushrod 13 disposed approximately at the center of the electrode, and thereafter it is stuck electrostatically by an electrostatic chuck 16 which is connected to a DC power source 24 and provided in the electrode 2, and its horizontal position and vertical position are held. The electrode 2 is formed of metallic materials such as aluminum or stainless steel. The electrostatic chuck 16 comprises, for example, a dielectric substance such as alumina mixed with silicon carbide or titanium oxide which is formed at a thickness of approximately 1 mm on top of the aluminum electrode. When a voltage of several hundred volts is impressed on the electrostatic chuck 16, the semiconductor wafer 1 is electrostatically stuck to the electrostatic chuck 16. Also, to control energy of ions incident on the semiconductor wafer 1 during plasma processing, a radio-frequency power source 12 with frequencies of several hundred KHz to several tens of MHz is connected to the electrode 2 via a matching device 11. Further, inside the electrode 2 is formed a refrigerant passage 15 through which a refrigerant for cooling runs to keep the temperature of the wafer heated by the plasma during processing at a constant.

Between the wafer 1 and the electrode 2, to promote heat transfer on the contact surface under low pressure, a non-reactive gas such as He of a few Torr to ten and several Torr is introduced through a flow passage 14. The surface of the electrode other than the wafer mounting surface is protected from the plasma and the non-reactive gas by means of a suscepter 17 and a cover 18 or the like.

On the other hand, at the upper position inside the chamber facing the wafer, an induction antenna system, a characteristic construction of the present invention, is installed. A spiral antenna 9 is grasped by insulating materials 25a, 25b, and 25c of alumina ceramics or the like and horizontally placed at the opposite side of the wafer 1. A center of the antenna 9 is connected to a current introducing terminal 30 to which are connected a matching device 7, then a high-frequency power source 8. Frequency of the high-frequency power source 8 is not particularly limited, but generally several hundred kHz to several hundred MHz, and 13.56 MHz which is the commercial frequency is the most practical. On the underside of the insulating material 25b, formed is a groove corresponding to the shape of the antenna to house the antenna 9, while on the upper side thereof formed is a duct 26 for running the refrigerant.

Figure 2:
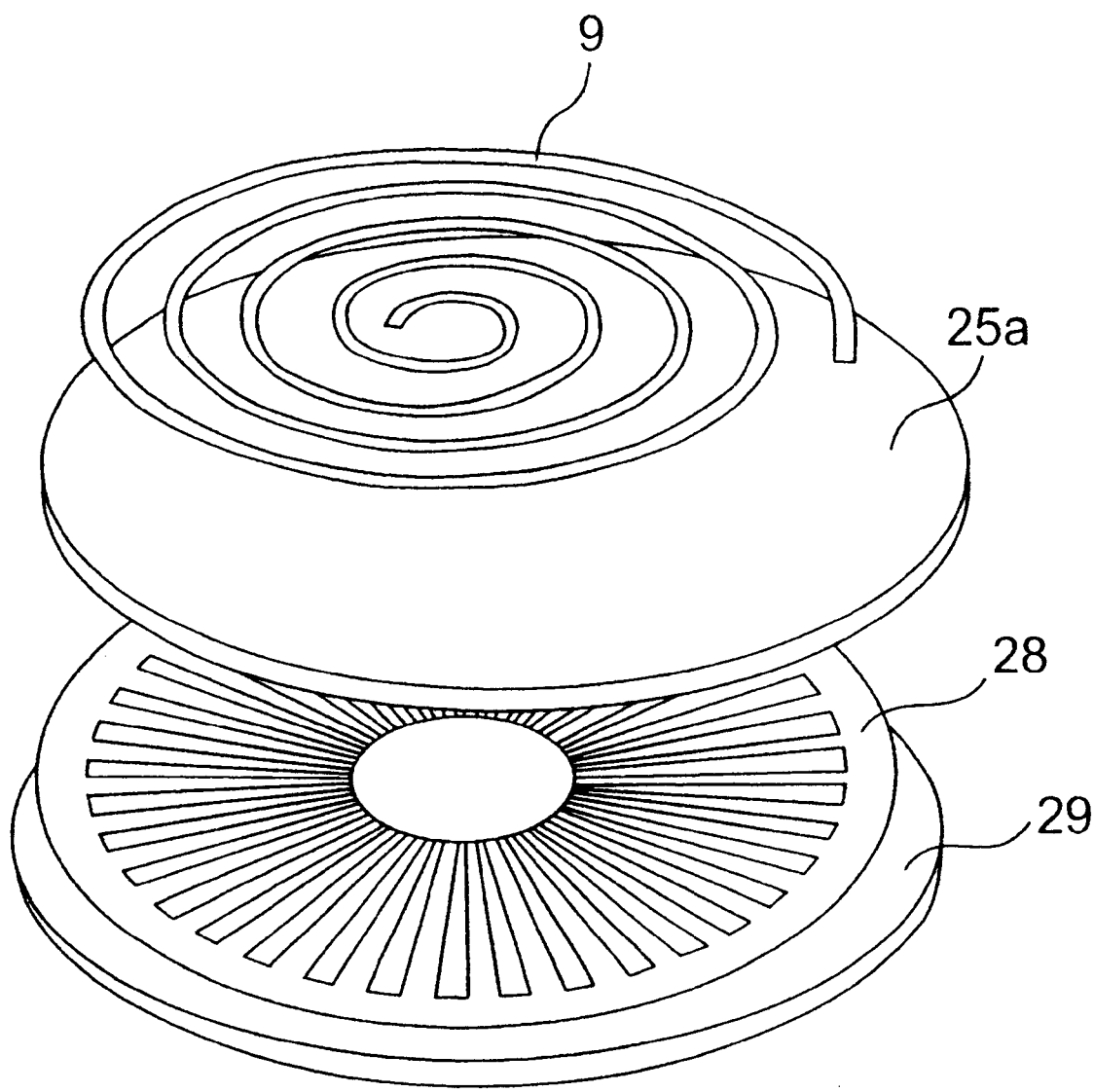
FIG. 2 is an exploded perspective view of an antenna portion.

On the underside of the insulating material 25a grasping the antenna 9 there is provided a Faraday shield 28 as shown in the exploded perspective view of FIG. 2. The Faraday shield 28 comprises a thin metallic sheet with slits being radially formed thereon and is connected to a current introducing terminal 40 which is connected to a switch 39 placed outside a vessel One end of the switch 39 is electrically earthed. The shield 28 is for preventing the antenna 9 and a plasma 4 from capacity coupling in terms of electric circuit, and prevents an insulating cover 29 comprising quartz or the like from being chipped and reduced. The switch 39 is provided to solve the problem of plasma ignition. Namely, to prevent the insulating cover 29 from being chipped, capacitive coupling between the antenna and the plasma must be prevented. On the other hand, when the plasma is first ignited, this capacitive coupling is needed. Accordingly, before the plasma is ignited, the switch 39 is turned off and the shield plate 28 is made to float from the earth. After ignition of the plasma, the switch 39 is turned on to let the shield function as the shield. Thus, both functions of preventing the cover material from being chipped and ignitability are secured.

In generally available plasma etching systems, radio frequency electric power is impressed on an electrode holding a wafer to cause a bias of negative potential on the wafer. However, distribution of this bias on the wafer surface is often non-uniform. This non-uniformity can be solved by setting up a firm earth at a position opposite to the wafer 1, but the shield plate 28 also functions as this opposite earth, and therefore, a uniform bias can be applied to the wafer.

Substantially at the center of the insulating cover 29 covering the underside of the antenna 9, there is formed a blow out port 31 for the processing gas. The processing gas is introduced from a processing gas introducing pipe 10 attached to the side of the chamber through a space between the insulating material 25a and the cover sheet 29 into the chamber 3 in the form of shower. It is desirable for the insulating materials 25a, 25b, and 25c and the antenna 9 to be built completely in one structure. However, because the dimensional accuracy of processing alumina ceramics cannot be made in high level at low cost and because the thermal expansions of the metal and ceramics are different, a gap of the order of at least 0.1 mm is produced between the antenna 9 and the insulating material 25b. As a result, heat transfer in the vicinity of this gap drops, so that the heat generated in the antenna 9 barely escapes to the refrigerant flow passage 26. In this embodiment, to promote heat transfer, in the same way as the case between the electrode 2 and the wafer 1, a non-reactive, heat-transfer promoting gas which may be one of the rare gases contained in gas supply means 37 such as He, Ar, and Xe as well as Nitrogen gas is introduced into the gap between the antenna 9 and the insulating material 25b in the quantity of a few Torr.

As described above, to increase the plasma generation efficiency, it is necessary to shorten the distance between the antenna 9 and the plasma 4. Hence, the thickness of the insulating material 25a is thin and the insulating material cannot withstand atmospheric pressure. However, if it has a thickness of a few milimeters, it can sufficiently take the pressure of a few Torr, although there is a possibility that the insulating material 25a may break down if a pressure differential between the pressure around the antenna and that of the processing chamber increases as a result of opening of the chamber to the atmosphere or a sudden occurrence of trouble. Consequently, pressure gauges 33 and 34 are used to monitor the above-mentioned pressures at all times. When a predetermined pressure differential occurs, a safety circuit 32 opens a valve 35 to cancel out the pressure differential. In this embodiment, the supply means 37 for feeding the refrigerants 27a and 27b for the antenna and the non-reactive gas is provided separately from the supply means 23 for feeding the refrigerants 19a and 19b for the electrode and the non-reactive gas. However, these supply means may be made common with each other to decrease the cost of the treatment device as a whole. Note that a mass flow meter 20 and a valve 21 for regulating the flow rate, a pressure gauge 22 for detecting line pressure or the like are connected to the supply means 23. Likewise, a mass flow meter 38 and a valve 36 are connected to the gas supply means 37.

Figure 3:
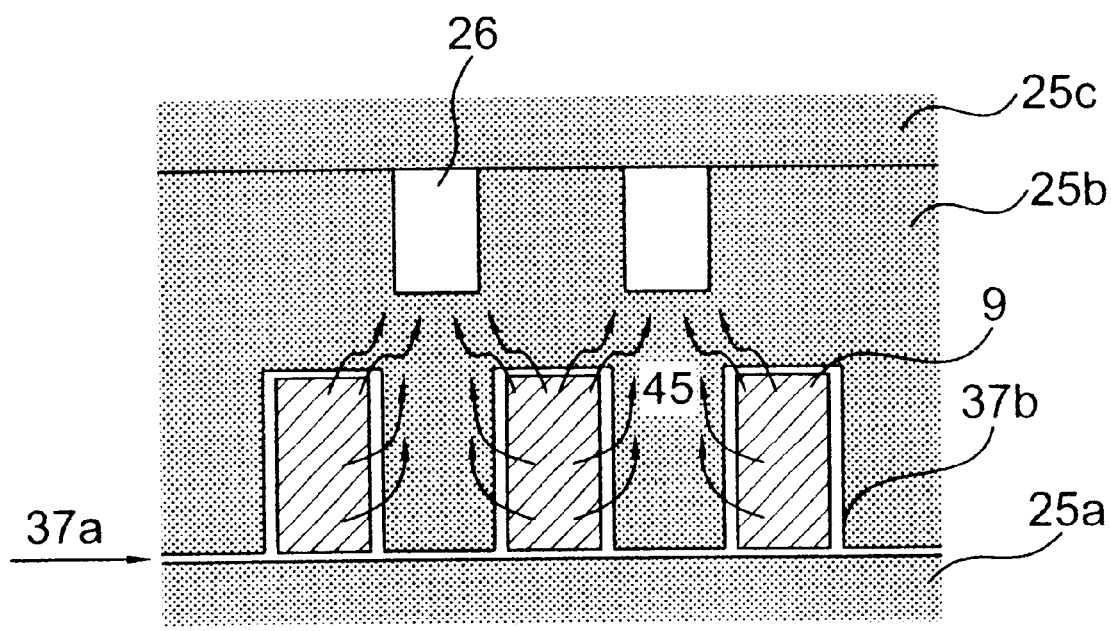
FIG. 3 is an enlarged schematic view of the vicinities of the antenna.

FIG. 3 shows an enlarged schematic view of the vicinities of the antenna. Heat 45 generated by the antenna 9 is conveyed to the insulating material 25b by heat transfer 37a which is introduced to an antenna part and the heat-transfer promoting gas 37b which fills up the gap, and conveyed through the refrigerant flow passage 26 to the outside. This space (gap) is hermetically formed with respect to the atmosphere and a plasma generating space, and the plasma generating space is formed by sealing the insulating material 25a by means of 0-ring. Since the heat-transfer promoting gas, if in small quantities, will not affect plasma processing, the hermetic arrangement is not always necessary with respect to the plasma generating space. Although not illustrated herein, grooves are formed on the surface of the insulating materials so that the gas can be sufficiently conveyed to the insulating materials 25a and 25b.

Secondary effects are brought about by using the heat-transfer promoting gas. For example, in etching process, the temperature of the chamber is one of the important parameters; especially, the temperature of the face opposite to the wafer gives a strong effect on etching. Therefore, as shown in FIG. 1, the cover material 29 facing the wafer is provided with temperature detecting means 41 to monitor the surface temperature. The temperature detected by the temperature detecting means 41 is fed back to the pressure of the heat-transfer promoting gas and the flow rate of the refrigerant, thereby regulating the temperature of the cover material 29.

Furthermore, instead of introducing the non-reactive gas on the order of a few Torr around the antenna, there are other measures, for example, filling up the gap between the antenna 9 and the insulating material 25b with a liquid such as silicon grease or a viscous matter or plugging up the gap with an epoxy resin of high thermal conductivity or the like. Yet, the materials which can be used in the field of semiconductor production are limited.

Figure 4:
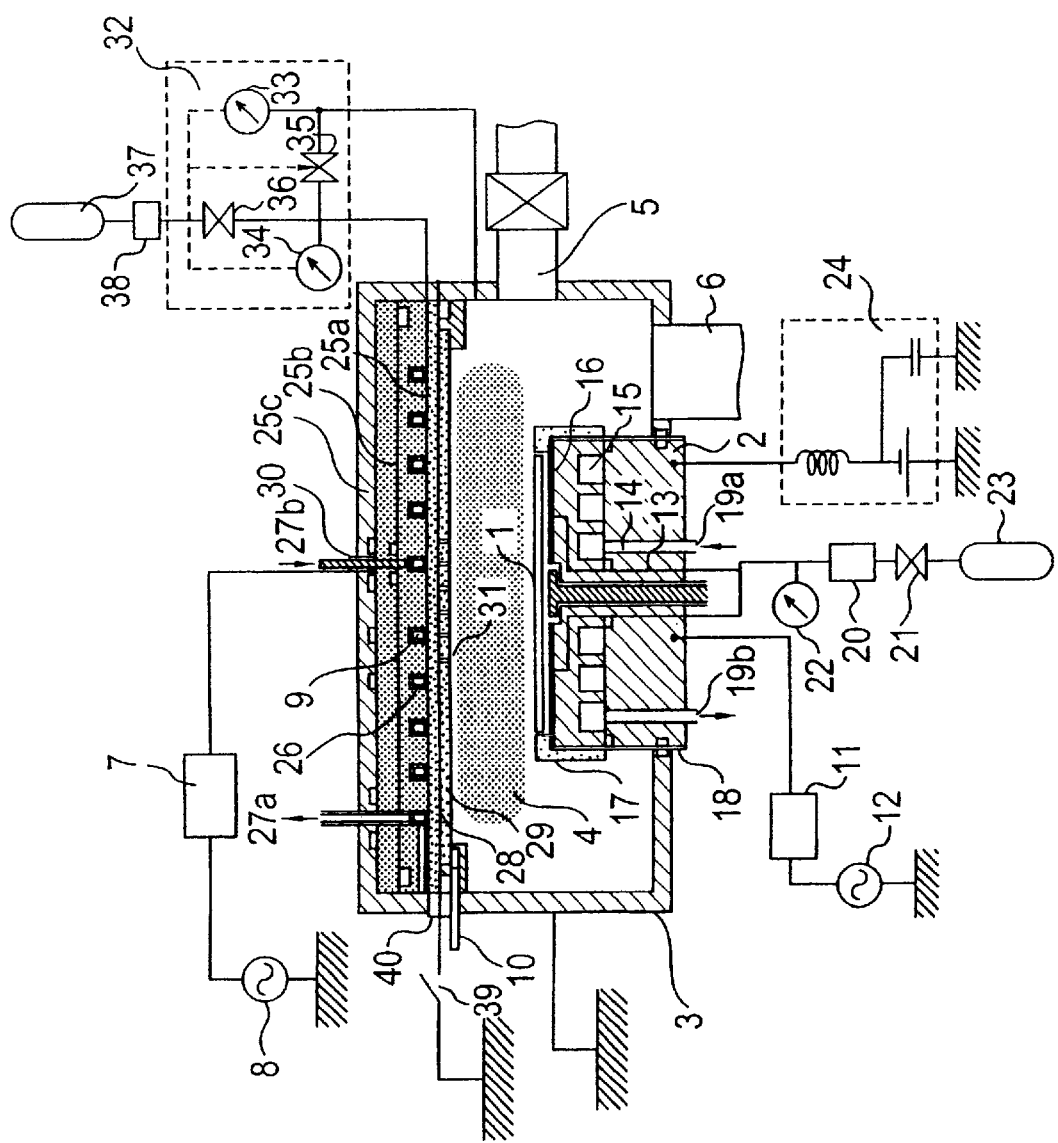
FIG. 4 is a schematic view of another embodiment of the plasma treatment device according to the present invention, showing a longitudinal sectional view of the main part.

A second embodiment of the present invention is shown in FIG. 4. In this embodiment, the spiral antenna 9 is formed in the shape of a tube and fluid for direct cooling is run the antenna. A construction in this manner will contribute to increasing the antenna cooling efficiency, while there is a need to run the refrigerant in the antenna on which a high-frequency power is impressed, thus causing a possibility of a decrease in reliability due to generation of corrosion.

Now, in the embodiment shown in FIG. 1, it is necessary to properly set the thickness of the insulating materials 25b and 25c provided on the antenna 9. When there is a metallic processing chamber wall in the range of a fluctuating magnetic field formed by the antenna 9, electrons in the plasma are supplied with energy from a high-frequency power source on account of inductive effect of the antenna to be heated. However, an inductive current is generated also in the metal of the chamber and this consumes power, so that the generation efficiency decreases.

Further, in the plasma treatment device disclosed in the above-mentioned Japanese Patent Unexamined Publication No. 7-106095, plasma is generated also behind the antenna, so that it is not necessary to be concerned with a distance between the antenna and the chamber behind it. However, it is highly possible that the plasma generated behind the antenna may not be used effectively for processing the workpiece, and the plasma generation efficiency will materially decrease as a result of generation of wasteful plasma. According to an experiment by the inventors of the present invention, it has been found that at least the distance between the antenna and the chamber must be larger than the distance between the antenna and the plasma, preferably more than double. That is, it is desirable for a distance from the underside of the antenna 9 to the underside of the cover 29 to be over twice a distance from the upper side of the antenna 9 to inside the upper part of the chamber 3.

Figure 5:
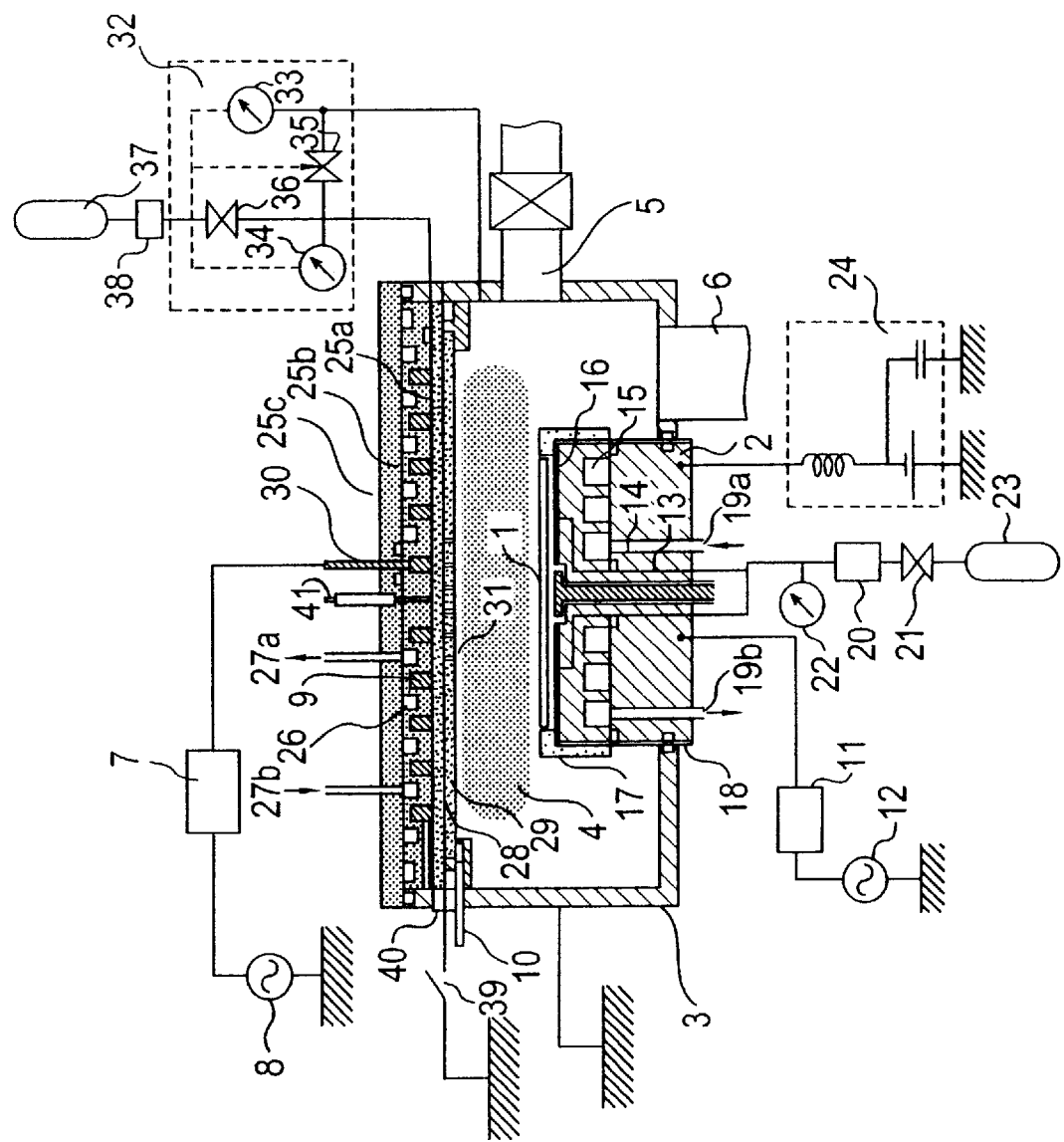
FIG. 5 to FIG. 8 are schematic views of further embodiments of the plasma treatment device according to the present invention, showing longitudinal sectional views of the main part.

In FIG. 5, another embodiment of the present invention is shown. In this embodiment, because the upper part of the antenna 3 is made up of the insulating material 25c, a decrease in the plasma generation efficiency resulting from the above-mentioned metal forming the chamber is cancelled out. This makes it unnecessary to be concerned with the thickness of the insulating material on the upper part of the antenna 9 and the device can be made compact.

Figure 6:
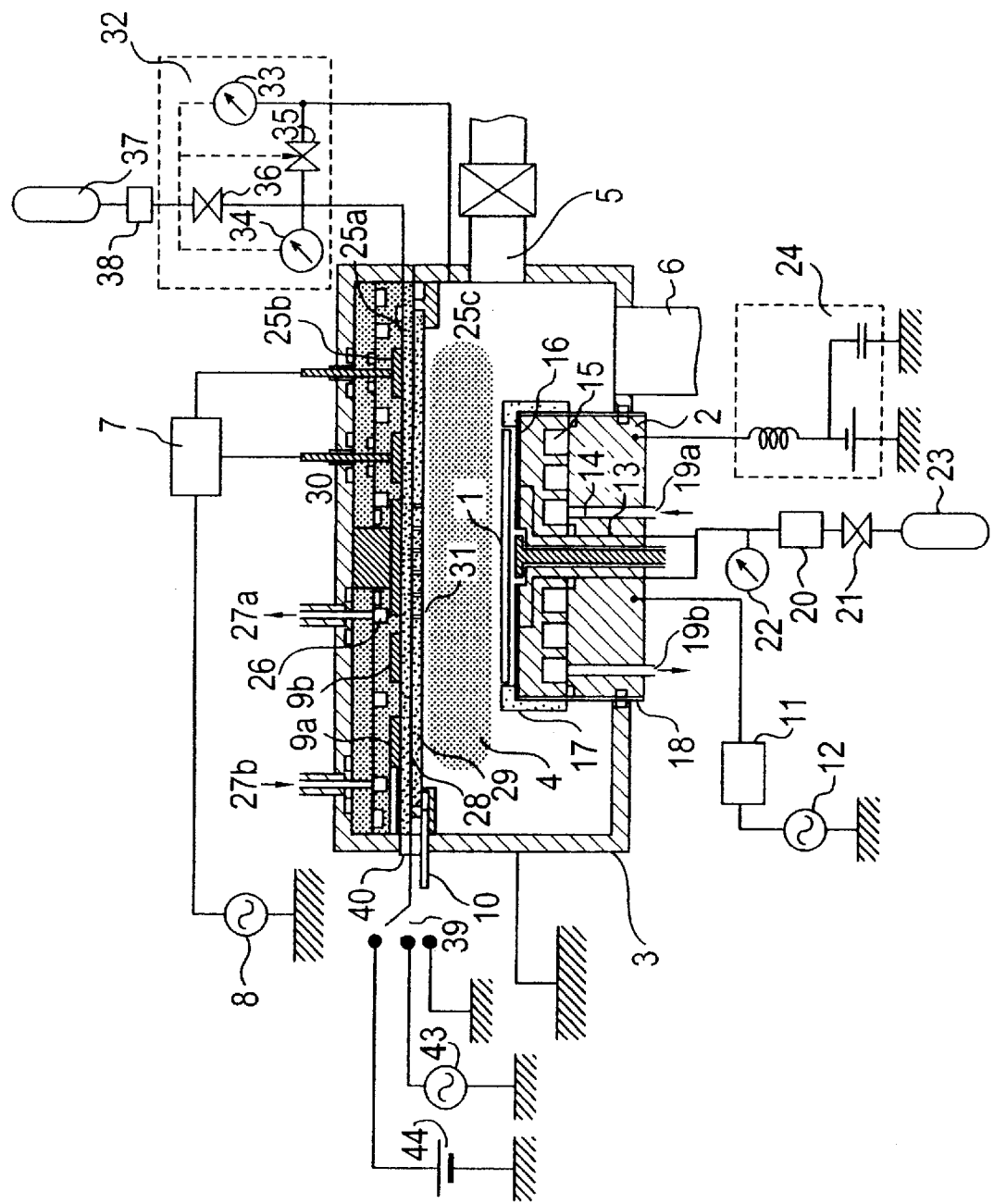

In FIG. 6, a still another embodiment of the present invention is shown. In this embodiment, the antenna comprises two one-turn coil antennas 9b and 9a arranged on the inside and the outside. A high-frequency power is fed to the antennas. Matching circuit 7 capable of distributing power properly to the respective antennas 9a and 9b is provided. The matching circuit 7 changes the feed ratio to the antennas 9b and 9a arranged on the inside and the outside of one another and controls a plasma distribution. Moreover, in this embodiment, it is possible to make the changeover of earth/non-earth with respect to the shield plate 28. Also, the shield plate 28 can be connected to a high-frequency current 43 or a DC power source 44. By impressing these forms of power on the shield plate 28, there is an effect of plasma-cleaning of reaction products deposited on the surface of the cover material 29.

Figure 7:
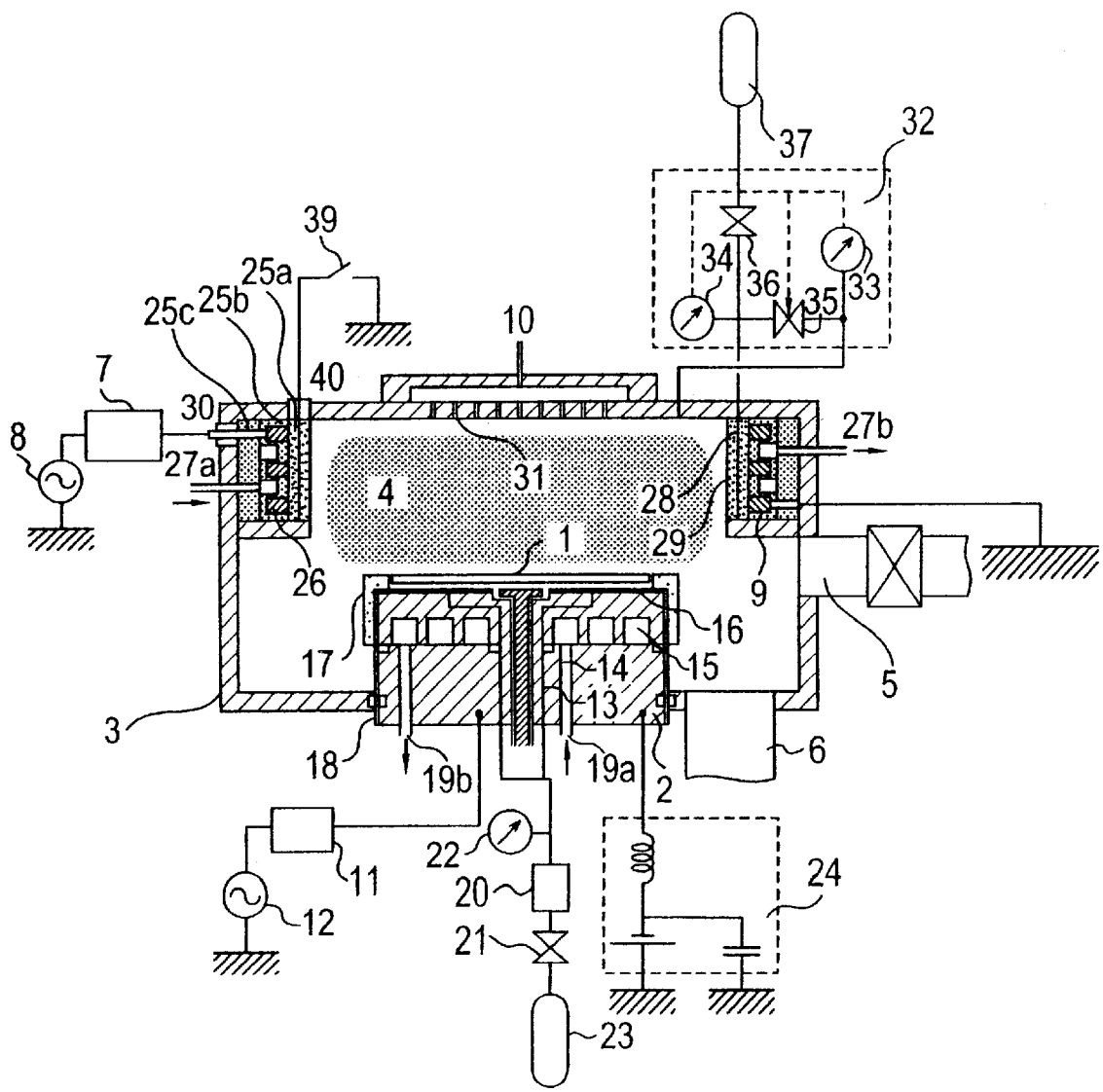

In FIG. 7, a further embodiment of the present invention is shown. In this embodiment, a coil-shape antenna 9 is mounted on one side of the chamber. Consequently, the cover 29, the shield 28 or the like is formed in the shape of a tube and yet there is obtained the same effect as the case of installing it at a position opposite the wafer as shown in FIG. 1. However, to hold the symmetry of gas flow, it is desirable to set up the blow out port 31 of the process gas at a position opposite to the wafer.

Figure 8:
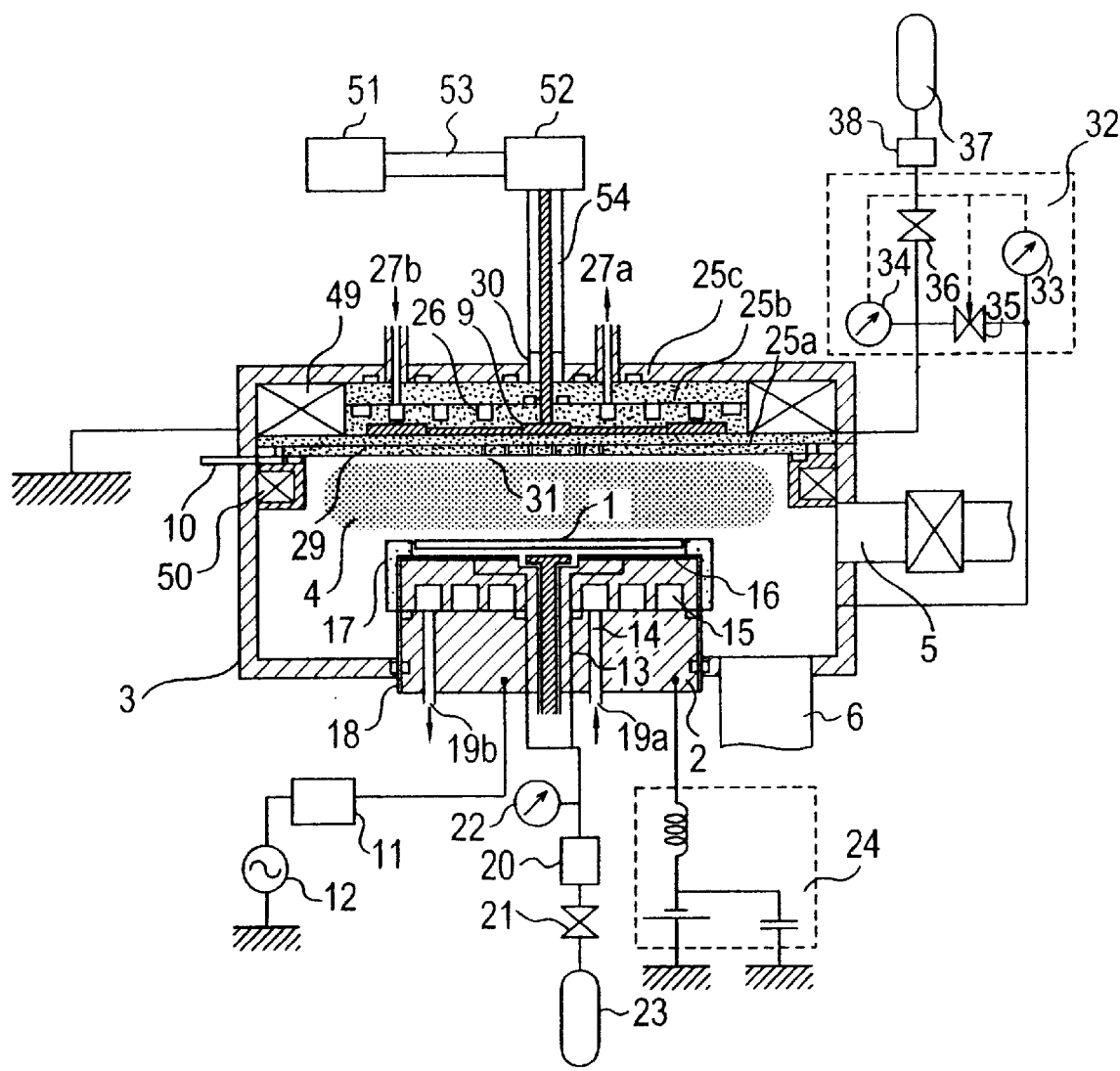

In FIG. 8, a still further embodiment of the present invention is shown. In this embodiment, the inductively coupled plasma treatment device will be described, and the same can be applied to the plasma treatment device of the electromagnetic wave radiation type from the antenna using high frequency such as microwaves.

In FIG. 8, a high-frequency power of several hundred MHz to a few GHz is fed from a magnetron 51 through a wave guide tube 53, a coaxial converter 52 and a coaxial line 54 to the antenna 9. From the antenna 9, electromagnetic waves are radiated and a magnetic field coil 49 provided on the side of the antenna 9 and a subsidiary coil 50 provided under this magnetic field coil form a static magnetic field. Plasma is generated by the interaction of the above-mentioned electromagnetic waves and this static electromagnetic field. A structure adjacent to the antenna is substantially the same as the embodiment shown in FIG. 1 but since it is not the inductively coupled plasma treatment device, the Faraday shield 29 is omitted. The present invention can be fully applied to a plasma treatment device so long as the device uses an antenna even though it is based on totally different principles from the inductively coupled plasma.

As described above, the embodiments of the present invention have been shown by taking the plasma etching device for manufacturing semiconductor devices as an example. The present invention is not limited to the plasma etching device but applicable to the plasma CVD device, the plasma ashing device, the plasma sputtering device or the like. Further, it can be applied to not only processing of semiconductor devices but also processing of liquid crystal display substrates and whole surface treatment. Still further, the plasma generation system is not limited to the plasma apparatus of the inductive coupling type. So long as the plasma generation method of the type where electromagnetic waves are radiated from the antenna is concerned, the present invention is applicable to a variety of devices.

Preferred embodiments described in this specification are illustrative and not restrictive. The scope of the invention is shown by the appended claims, and all changes and modifications that fall within the meaning of these claims are contained in the present invention.

What is claimed is:

1. A plasma treatment device, comprising a hermetically sealed processing chamber, gas introducing means for introducing a processing gas, attached to the processing chamber, exhaust means for exhausting the processing gas introduced into said processing chamber, mounting means for mounting a workpiece, disposed in said processing chamber, and power source means for supplying power for plasma generation, characterized in that antenna means for plasma generation is connected to said power source means, and said antenna means is covered with an insulating material integrated with said processing chamber, wherein said antenna means includes first and second antennas, and each of said first and second antennas is connected to said power source means.

2. The plasma treatment device according to claim 1, wherein each of said first and second antennas includes a one-turn coil.

3. A plasma treatment device, comprising a hermetically sealed processing chamber, gas introducing means for introducing a processing gas, attached to the processing chamber, exhaust means for exhausting the processing gas introduced into said processing chamber, mounting means for mounting a workpiece, disposed in said processing chamber, and power source means for supplying power for plasma generation, characterized in that an antenna for plasma generation is connected to said power source means, and the antenna is covered with an insulating material integrated with said processing chamber, wherein a shield plate comprising a conductive material is arranged between said antenna and a plasma generating space, and wherein changing means for changing earth and non-earth of said shield plate is provided.

4. The plasma treatment device according to claim 3, wherein an insulating material having a thickness at least larger than a distance between the antenna and a plasma generating position is disposed between said processing chamber and said antenna.

5. The plasma treatment device according to claim 3, wherein said antenna is arranged opposite an upper surface of said mounting means.

6. The plasma treatment device according to claim 3, wherein a part surrounding said antenna in said processing chamber is formed of an insulating material.

7. The plasma treatment device according to claim 3, wherein means for introducing non-reactive gas having a pressure at least lower than atmospheric pressure is disposed in a space defined by said antenna in said chamber and an insulating material arranged around the periphery of said antenna.

8. The plasma treatment device according to claim 3 further comprising temperature detection means for detecting a temperature of said workpiece, temperature regulating means for regulating the temperature of said workpiece on the basis of the temperature detected by the temperature detection means, and refrigerant supply means for regulating the temperature of said antenna.

9. The plasma treatment device according to claim 3, wherein microwaves are applied to said antenna by said power supply means, and the frequency of the microwaves is in the range of 400 kHz to 100 MHz.

10. The plasma treatment device according to claim 3, wherein the workpiece which is mounted on the mounting means is a semiconductor wafer of a semiconductor device, the semiconductor wafer having a surface thereof plasma-processed by the plasma generated between the antenna and the semiconductor water which is disposed in the chamber opposite to the antenna, the antenna being formed integrally with the hermetically sealed processing chamber.

11. The plasma treatment device according to claim 3, wherein the workpiece which is mounted on the mounting means is a semiconductor wafer of a liquid crystal display substrate, the semiconductor wafer having a surface thereof plasma-processed by a plasma generated between the antenna and the semiconductor wafer which is disposed in the chamber opposite to the antenna, the antenna being formed integrally with the hermetically sealed processing chamber.

12. A plasma treatment device, comprising a hermetically sealed processing chamber, gas introducing means for introducing a processing gas, attached to the processing chamber, exhaust means for exhausting the processing gas introduced into said processing chamber, mounting means for mounting a workpiece, disposed in said processing chamber, and power source means for supplying power for plasma generation, characterized in that an antenna for plasma generation is connected to said power source means, and the antenna is covered with an insulating material integrated with said processing chamber, wherein a shield plate comprising a conductive material is arranged between said antenna and a plasma generating space, and wherein said shield plate is connected to a high-frequency power source.

13. A plasma treatment device, comprising a hermetically sealed processing chamber, gas introducing means for introducing a processing gas, attached to the processing chamber, exhaust means for exhausting the processing gas introduced into said processing chamber, mounting means for mounting a workpiece, disposed in said processing chamber, and power source means for supplying power for plasma generation, characterized in that an antenna for plasma generation is connected to said power source means, and the antenna is covered with an insulating material integrated with said processing chamber, wherein a shield plate comprising a conductive material is arranged between said antenna and a plasma generating space, and wherein said shield plate is connected to a DC power source.

14. A plasma treatment device, comprising a hermetically sealed processing chamber, gas introducing means for introducing a processing gas, attached to the processing chamber, exhaust means for exhausting the processing gas introduced into said processing chamber, mounting means for mounting a workpiece, disposed in said processing chamber, and power source means for supplying power for plasma generation, characterized in that an antenna for plasma generation is connected to said power source means, and the antenna is covered with an insulating material integrated with said processing chamber, and further comprising an insulating material covering said antenna, first detection means for detecting a pressure of a space defined by the insulating material and said antenna, and second detection means for detecting a pressure in the processing chamber connected to the space via a communicating path having control means for opening and closing said communication path, wherein there is disposed means for opening said control means for opening and closing said communicating path when a pressure differential between the pressures detected by said first and said second detection means exceeds a predetermined value.

15. A plasma treatment device, comprising a hermetically sealed processing chamber, gas introducing means for introducing a processing gas, attached to the processing chamber, exhaust means for exhausting the processing gas introduced into said processing chamber, mounting means for mounting a workpiece, disposed in said processing chamber, and power source means for supplying power for plasma generation, characterized in that an antenna for plasma generation is connected to said power source means, and the antenna is covered with an insulating material integrated with said processing chamber, wherein a shield plate comprising a conductive material is arranged between said antenna and a plasma generating space, and wherein supply means for supplying non-reactive gas is disposed between said workpiece and said mounting means, and the supply means supplies the non-reactive gas for heat transfer promotion to a periphery of said antenna.

16. A plasma treatment device, comprising a hermetically sealed processing chamber, gas introducing means for introducing a processing gas, attached to the processing chamber, exhaust means for exhausting the processing gas introduced into said processing chamber, mounting means for mounting a workpiece, disposed in said processing chamber, and power source means for supplying power for plasma generation, characterized in that an antenna for plasma generation is connected to said power source means, and the antenna is covered with an insulating material integrated with said processing chamber, wherein a shield plate comprising a conductive material is arranged between said antenna and a plasma generating space, and wherein temperature detection means for detecting a temperature of a member placed in a vicinity of said antenna and non-reactive gas supply means for supplying non-reactive gas to the vicinity of said antenna are disposed to said member placed in the vicinity of said antenna, and pressure control means for controlling a pressure of the non-reactive gas is provided to the non-reactive gas supply means, and regulating means for regulating the temperature of said member in the vicinity of the antenna on the basis of the pressure of the non-reactive gas and the temperature of the member detected by said temperature detection means is provided.

* * * * *